(12) United States Patent
Riccio

(10) Patent No.: US 6,417,716 B1
(45) Date of Patent: Jul. 9, 2002

(54) CMOS VOLTAGE SHIFTER

(75) Inventor: Ettore Riccio, Vimodrone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/608,974

(22) Filed: Jun. 30, 2000

(30) Foreign Application Priority Data

Jul. 2, 1999 (IT) .......................................... MI99A1476

(51) Int. Cl.$^7$ ................................................. H03L 5/00
(52) U.S. Cl. ......................................... 327/333; 326/68
(58) Field of Search ............................. 327/55, 65, 67, 327/143, 333; 326/62, 63, 80, 81, 68

(56) References Cited

U.S. PATENT DOCUMENTS 5,818,257 A * 10/1998 Villa .............................. 326/81
6,064,227 A * 5/2000 Saito ............................. 326/68

* cited by examiner

*Primary Examiner*—Terry D. Cunningham
*Assistant Examiner*—Quan Tra
(74) *Attorney, Agent, or Firm*—Lisa K. Jorgenson; Robert Iannucci; Seed IP Law Group, PLLC

(57) ABSTRACT

Presented is a high-efficiency CMOS voltage shifter including a differential cell circuit portion powered between first and second supply voltage references, and a first pair of transistors connected into a cascode configuration. Also included is a first divider of the first supply voltage reference for generating a reference voltage value on a first internal circuit node, which is connected to the gate terminals of the transistors in the first pair. The voltage shifter further includes a second divider of the first supply voltage reference for controlling the value of the reference voltage by means of a control circuit portion acting on the first divider.

19 Claims, 5 Drawing Sheets

US 6,417,716 B1

CMOS VOLTAGE SHIFTER

TECHNICAL FIELD

This invention relates to a CMOS voltage shifter, and more particularly a shifter including a differential cell circuit operational when supplied with a low high supply reference voltage.

BACKGROUND OF THE INVENTION

Voltage shifters are used for many applications, especially in integrated circuits, to raise or lower a supply voltage of a relatively low value (typically 3.3V to 5V), as appropriate for circuitry connected to that supply voltage.

A conventional differential cell voltage shifter 1 is illustrated generally by the diagram of FIG. 1.

The voltage shifter 1 is supplied a relatively high voltage reference VDDHIGH, e.g., above the maximum voltage that can be applied to a MOS transistor.

In particular, the high voltage reference VDDHIGH is supplied to a first pair of P-type MOS transistors MP1 and MP2, which are cross-connected together so as to have their respective gate and drain terminals connected to the source terminals of a second pair of P-type MOS transistors MP3 and MP4. The gate terminals of the second transistor pair MP3, MP4 receive a reference voltage VREF which is generated locally.

The second pair of transistors MP3 and MP4 have their drain terminals connected to respective source terminals of a pair of N-type MOS transistors MN1 and MN2, the gate terminals of which are driven respectively by an input signal VIN presented on an input terminal IN of the voltage shifter 1, and its inverse provided by an inverter INV which is connected between the input terminal IN and the gate terminal of the transistor MN2. The voltage shifter 1 also has an output terminal OUT which is coincident with the source terminal of the transistor MN2.

The NMOS transistors MN1 and MN2 are drift transistors, that is, transistors which are formed to accept a high voltage value, such as VDDHIGH, on their drain terminals only, without involving any alterations of the process steps or the masks used for manufacturing standard MOS transistors.

As shown in FIG. 1, a reference voltage VREF is set by a divider, formed of first and second P-type MOS transistors MP5 and MP6, which are connected in series with each other in a diode configuration between the high voltage reference VDDHIGH and a ground reference GND.

Where these transistors MP5, MP6 are selected identical with each other, a value of the reference voltage VREF is obtained which is one half the value of the high voltage VDDHIGH, namely:

$$VREF = VDDHIGH/2 \qquad (1)$$

The different conditions of operation of the voltage shifter 1 will now be discussed.

When the value of the input signal VIN to the input terminal IN is same as or near that of the ground reference GND, the drain terminals of the transistors MP1 and MP2 are at VDDHIGH, and the drain terminals of the transistors MP3 and MP4 are at GND and VDDHIGH+Vth(MP4), respectively, with Vth(MP4) being the threshold voltage value for the transistor MP4.

The terminals of all PMOS transistors exhibit a voltage drop of VDDHIGH+Vth(PMOS), with Vth(PMOS) being the threshold voltage value of a PMOS transistor. This value normally is adequate to power the transistors in question. Otherwise, additional cascode stages, that is, additional pairs of PMOS transistors in the same configuration as the transistors MP3 and MP4, would have to be introduced.

Further, the drain terminal of the transistor MN1 is at VDDHIGH. This value can only be accepted because drift NMOS transistors are used instead of standard NMOS transistors.

When the input signal VIN to the input terminal IN is changed, from a value near GND to a value equal to a further supply voltage reference VDDLOW of lower value than VDDHIGH, the drain terminal of the transistor MN1 is taken down to GND and the source terminal of the transistor MP3 up to a value of VREF+Vth(MP3), with Vth(MP3) being the threshold voltage value of the transistor MP3. As the voltage value across the gate and source terminals of the transistor MP3 drops below the threshold voltage Vth(MP3) thereof, the transistor MP3 is turned off.

Likewise, as the voltage value of VDDHIGH−VREF+Vth(MP3) across the gate and source terminals of the transistor MP2 rises above the threshold voltage Vth(MP2) thereof, this transistor is turned on, and the voltage value at the output terminal OUT of the voltage shifter 1 is taken up to the high voltage value VDDHIGH.

The maximum voltage drop across the terminals of the PMOS transistors comprising the voltage shifter 1 is of VDDHIGH+Vth(PMOS), even under this condition of their operation.

Thus, assuming all the PMOS transistors MP1, MP2, MP3, MP4 to have the same threshold voltage value Vth', the minimum high voltage value for proper operation of the voltage shifter 1 is:

$$VDDHIGHmin = 2*Vth' + VREF \qquad (2)$$

Because of this restriction on the high voltage value that can be used for powering it, a voltage shifter 1 as described hereinabove cannot be used for a simple decoupling stage, or buffer stage, in order to apply the low voltage value VDDLOW directly to the source terminals of the transistors MP1 and MP2, when this value VDDLOW is smaller than 2*Vth+VREF.

In practice, however, low voltage values VDDLOW in this "forbidden" range are a common occurrence in applications of submicron CMOS technology.

Until now, no voltage shifter exits that can be operated at voltage values higher than or equal to, in absolute value, the input voltage values, even when this input voltage drops below a limiting value, at no risk for the integrity of the MOS transistors contained in the shifter during operation on a high voltage supply. Also until now, no voltage shifter exist that requires no additional external signals.

SUMMARY OF THE INVENTION

Embodiments of the invention of have the value of an internally generated reference voltage VREF adjusted to suit the value of the higher voltage, VDDHIGH. In particular, the value of the reference voltage VREF will be reduced as the value of the voltage VDDHIGH decreases.

Presented is a CMOS voltage shifter including differential cell circuit portion coupled between a first and a second supply voltage reference, and including a first pair of transistors coupled in a cascode configuration. The voltage shifter uses both a first voltage divider and a second voltage divider. The first voltage divider generates a reference voltage value on a first internal circuit node that is coupled to gate terminals of the first pair of transistors, while the second voltage divider generates another reference voltage value applied to the first internal circuit node when necessary, based on the voltage VDDHIGH.

Also presented is a method of shifting a voltage in a memory circuit supplied with a high voltage supply and a reference voltage supply. The method includes alternatively selecting as an output signal of the voltage shifter either a ground voltage or a voltage generated through a core of the voltage shifter. If the generated voltage is selected as the output signal, the method generates the output voltage by applying a reference voltage generated by a first voltage divider to a set of gates of transistors in the core of the voltage shifter. If a low voltage value on the high voltage supply prevents the voltage shifter from generating the second voltage, the method generates a second reference voltage from a second voltage divider and applies the second reference voltage to the set of gates of the core transistors.

The features and advantages of a voltage shifter according to the invention will be apparent from the following description of an embodiment thereof, given by way of non-limitative example with reference to the accompanying drawings.

DETAILED DESCRIPTION OF THE INVENTION

Figure 2:
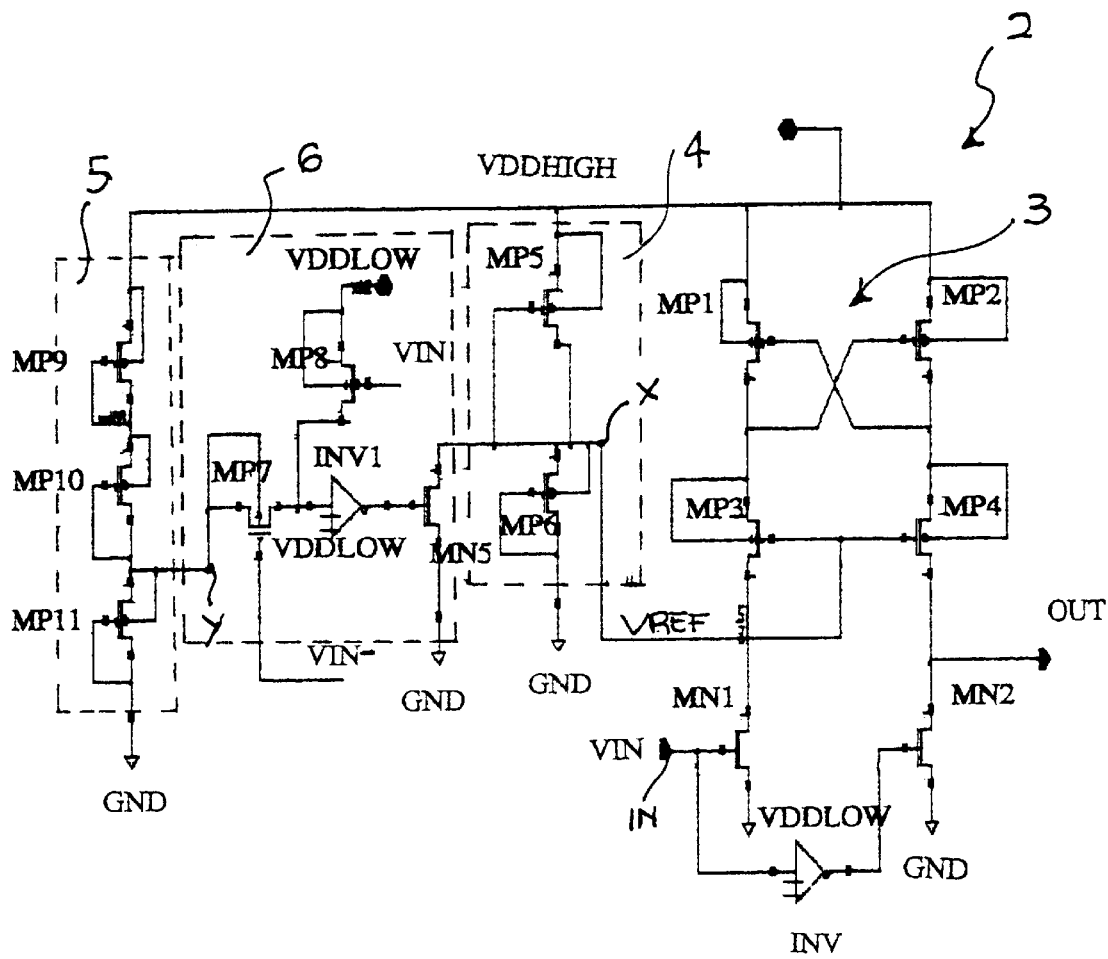
FIG. 2 shows a voltage shifter according to an embodiment of the invention.

Referring to the drawing views, and particularly to FIG. 2, a voltage shifter according to the invention is shown generally at 2 in schematic form.

In FIG. 2, as well as throughout the specification, construction and function-wise similar elements to the conventional voltage shifter 1 are denoted by the same references.

In particular, the voltage shifter 2 has a differential cell circuit portion 3 which comprises a first pair of P-type MOS transistors MP1 and MP2, having their source terminals connected to a first supply voltage reference, specifically a high voltage reference VDDHIGH, and having their gate and drain terminals cross-connected to the source terminals of a second pair of PMOS transistors MP3 and MP4, in a cascode configuration.

The gate terminals of the transistors MP3 and MP4 are applied a reference voltage VREF which is generated inside the voltage shifter 2 by a first voltage divider 4 connected between said high voltage reference VDDHIGH and a second voltage reference, e.g., a signal ground GND.

The drain terminals of these transistors MP3 and MP4 are connected to respective source terminals of a pair of N-type MOS transistors MN1 and MN2, having their gate terminals driven respectively by an input signal VIN presented on an input terminal IN of the voltage shifter 2 and its inverse, as provided by an inverter INV connected between the input terminal IN and the gate terminal of the transistor MN2.

The voltage shifter 2 has an output terminal OUT which is coincident with the source terminal of the transistor MN2.

Similar to the voltage shifter 1, the NMOS transistors MN1 and MN2 are drift transistors, that is transistors formed to accept a high voltage value, such as VDDHIGH, on their drain terminals only.

The first voltage divider 4 is formed of first and second P-type MOS transistors, MP5 and MP6, connected, in a diode configuration and in series with each other, between the high voltage reference VDDHIGH and ground GND, so as to generate the reference voltage VREF on a first internal circuit node X, defined by the gate terminal of the transistor MP5.

Advantageously, the voltage shifter 2 includes a second voltage divider 5, connected between the high voltage reference VDDHIGH and ground GND, which is effective to produce a predetermined voltage value VY on a second internal circuit node Y.

In the particular embodiment shown in FIG. 2, the second voltage divider 5 includes three P-type MOS transistors MP9, MP10 and MP11 connected, in series and in a diode configuration, between the high voltage reference VDDHIGH and ground GND. The second internal circuit node Y is connected to the gate terminal of the transistor MP10, which is in turn connected to the drain of the transistor MP10 itself and connected to the source terminal of the transistor MP11.

Advantageously, the second voltage divider 5 sets the value of the voltage VY at VDDHIGH/3.

The value of the voltage VY is then applied to the first internal circuit node X by means of a control circuit portion 6 acting on the first divider 4.

In particular, this control circuit portion 6 additionally includes an N-type MOS drive transistor MN5, connected between the internal circuit node X and the ground reference GND and having its gate terminal connected to the internal circuit node Y through a series of an enable PMOS transistor MP7 and an inverter INV1. The enable transistor MP7 is driven by the negated VIN– of the input signal VIN.

A bias PMOS transistor MP8 is connected between a low supply voltage reference VDDLOW and the input of the inverter INV1, and is driven by the input signal VIN.

The first internal circuit node X is, therefore, connected through the control circuit portion 6 to the second internal circuit node Y, itself connected to the high voltage reference VDDHIGH.

In this way, the voltage shifter 2 will adjust the value of the reference voltage VREF according to the value of the high voltage reference VDDHIGH. In particular, the high voltage reference VDDHIGH is monitored through the second divider 5 and the resulting signal from the drive transistor MN5 by means of the inverter INV1.

As the value of the high voltage reference VDDHIGH drops below a predetermined limiting value, the input of the inverter INV1 drops below its threshold value, causing it to switch over to the drive transistor MN5.

The operation of the voltage shifter 2 according to this embodiment of the invention will now be described in detail.

When the value at the input terminal VIN goes HIGH, i.e., reaches the value of the low voltage reference VDDLOW, the value VIN being allowed to vary between VDDLOW and GND, the bias transistor MP8 goes off, and the enable transistor MP7, being driven by the inverted value VIN–, goes on. Thus, the value VY=VDDHIGH/3 presented on the second internal circuit node Y is input to the inverter INV1 through the enable transistor MP7.

As long as VDDHIGH/3 stays higher than the value VDDLOW–Vth(PMOS), i.e., above the value being input to the inverter INV 1 from the bias transistor MP8, the output of the inverter INV1 will definitely go to ground GND, and the drive transistor MN5 will be off.

Under such conditions, the core of the voltage shifter comprised of the transistors MP1, MP2, MP3, MP4, MP5, MP6, MN1 and MN2 behaves similar as in the prior art, with the value of the reference voltage VREF being VDDHIGH/2. The voltage shifter 2 operates correctly in that the following condition applies:

$$VDDHIGH=2*Vth'+VREF$$

where, Vth' is the threshold value of the PMOS transistors used.

Conversely, as VDDHIGH/3 drops below the value VDDLOW−Vth(PMOS), the inverter INV1 goes on, and when VDDHIGH/3 becomes sufficiently low, the inverter output goes to VDDLOW. In this case, the drive transistor MN5 will take the value of the reference voltage VREF to ground GND.

In this condition, the high voltage reference VDDHIGH driving the core of the voltage shifter, comprised of the transistors MP1, MP2, MP3, MP4, MP5, MP6, MN1 and MN2, should be only 2*Vth' higher, since the contribution from VREF is zero.

Thus, a voltage shifter is obtained which can also be operated at low values of the high supply voltage reference VDDHIGH.

It should be noted that for the voltage shifter to operate as expected, the drive transistor MN5 should be a suitable size to draw a larger current than the transistor MP5.

The voltage shifter 2 has been simulation tested by the Applicant using an ELDO program with HCMOS6 technology, at a value of the operating temperature set at 25° C. and typically using MM9 models.

Figure 3:
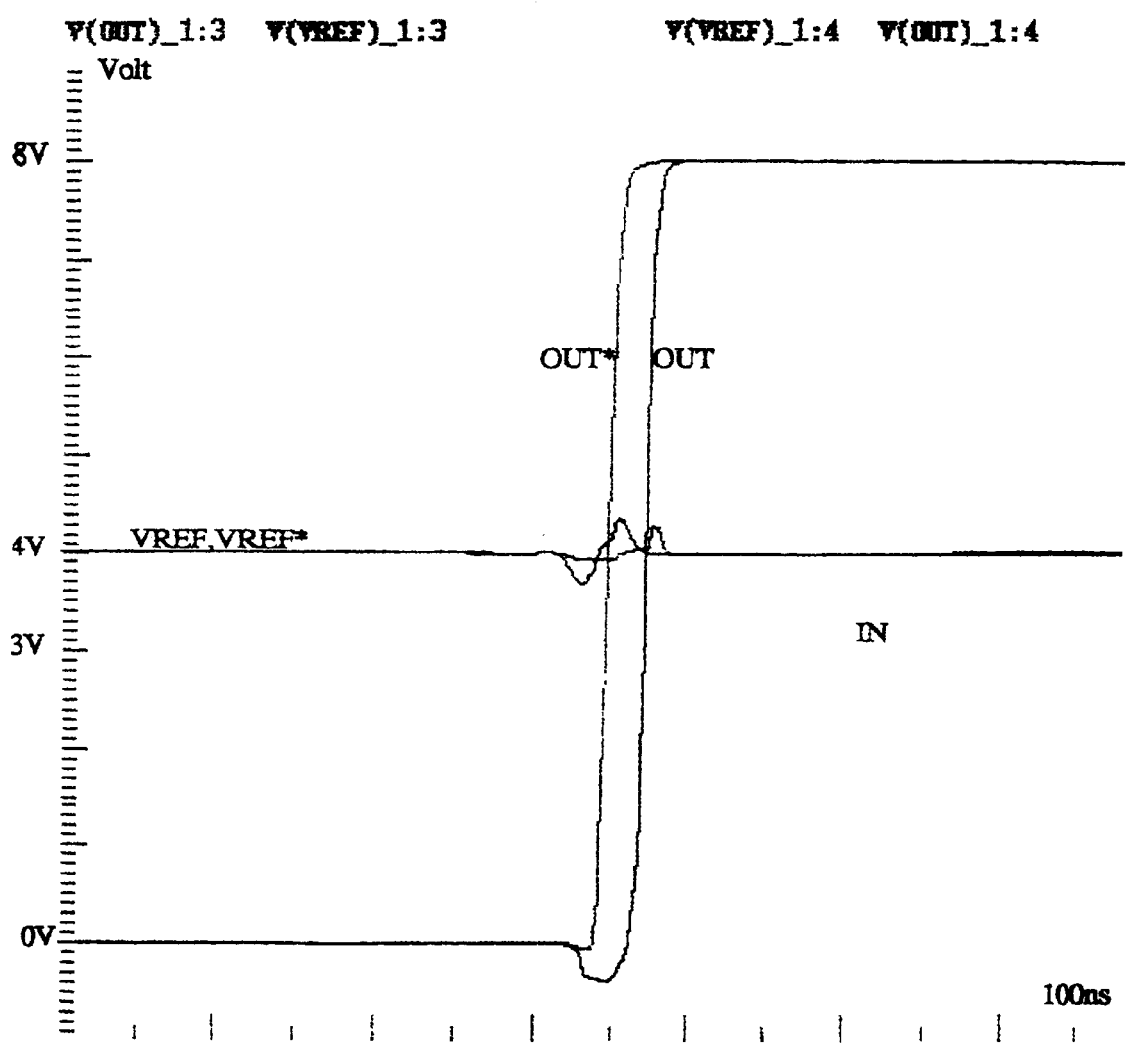
FIGS. 3 and 4 show comparative patterns for internal signal of the shifters in FIGS. 1 and 2.
Figure 4:
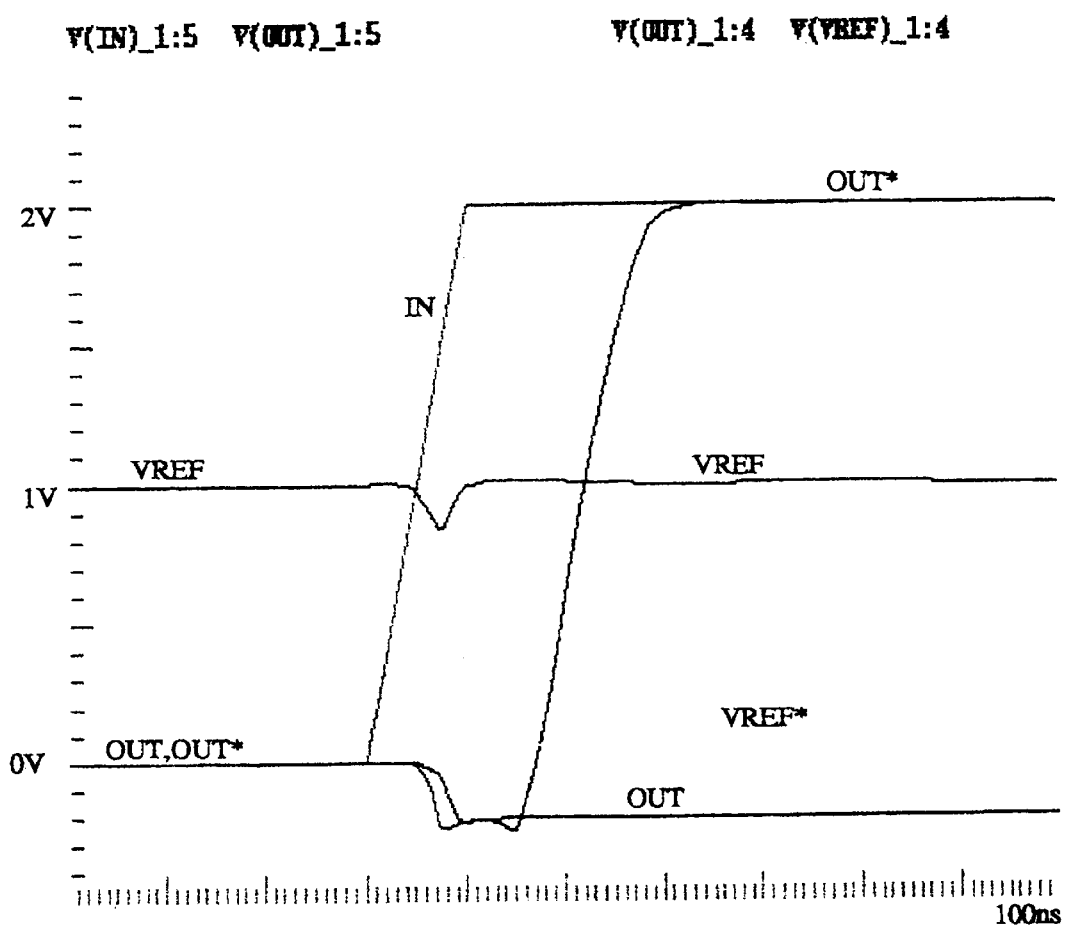

FIGS. 3 and 4 are comparative plots illustrating the results of that simulation, for a conventional shifter and the shifter according to the embodiment shown in FIG. 2.

In particular, FIG. 3 shows that either structures operate properly at VDDHIGH=8V and VDDLOW=3.3V, with OUT being the output value from the conventional voltage shifter and OUT* the output value from the voltage shifter described with reference to FIG. 2.

Figure 1:
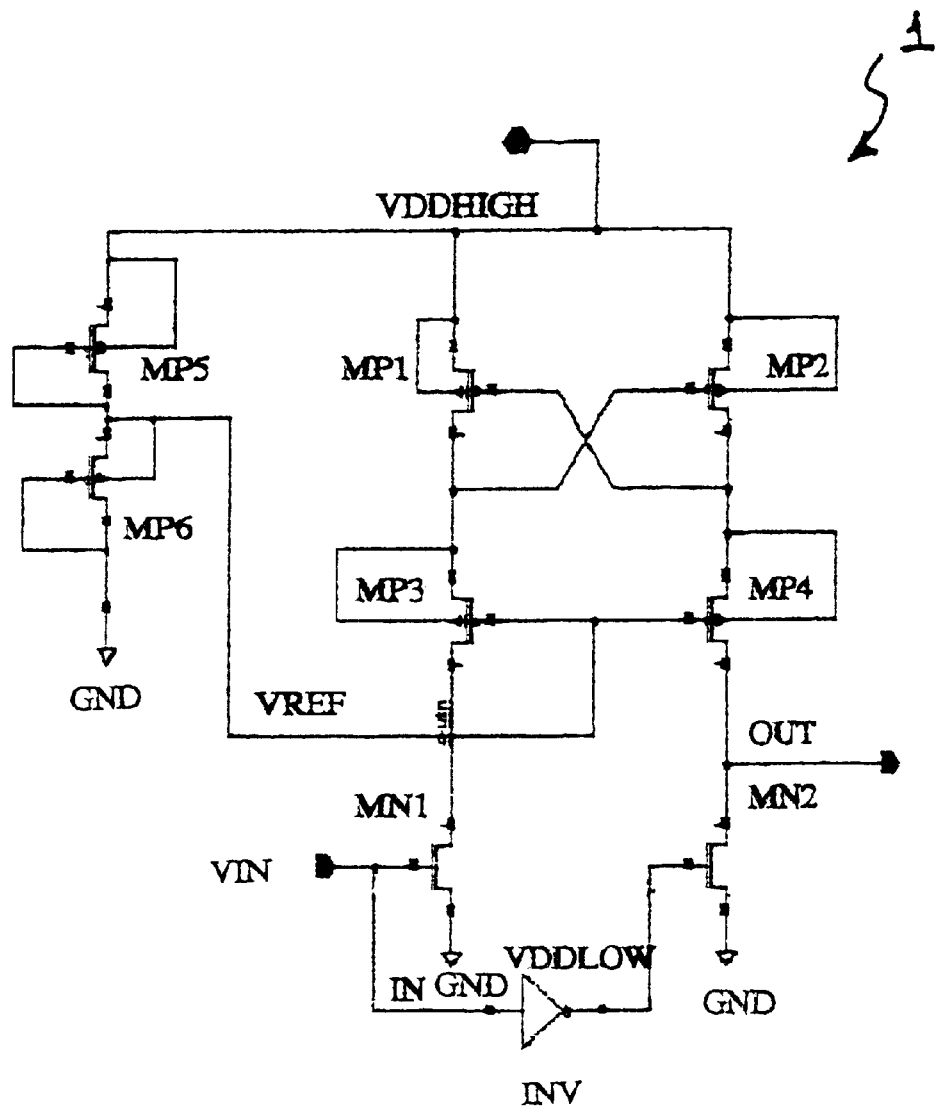
FIG. 1 shows a voltage shifter according to the prior art.

FIG. 4 illustrates that, where VDDHIGH=VDDLOW= 2.0V, i.e., with the voltage shifter being operated as a buffer, only the output signal OUT* from the voltage shifter 2 of FIG. 2 can be switched over by the signal IN and thus ensure proper operation. The voltage shifter 1 of FIG. 1 is inoperative, or, produces incorrect results.

FIGS. 3 and 4 show, moreover, the patterns of the reference voltages VREF and VREF* for both the conventional and the described shifters, which highlight the control exerted on the internally generated voltage by the voltage shifter of FIG. 2 according to the value taken by the high voltage reference VDDHIGH.

To summarize, the described voltage shifter can be advantageously used for all applications where a specific circuit is to utilize two different voltage levels, of which the high one is apt to affect the reliability of the devices connected to it and the low one the reliability of the buffer-function circuit itself. The described voltage shifter can shift and buffer the voltage without requiring any additional control signals.

In particular, the voltage shifter of FIG. 2 can be used to save space, since it combines two different functions in a single device, and involves no introduction of external control signals, such as would interfere with the addressing and the power outputs.

One exemplary application of the voltage shifter according to the invention would be an OTP (One-Time Programmable) memory which is used in an environment incorporating no MOS transistors, and is suitable for high voltage applications.

Figure 5:
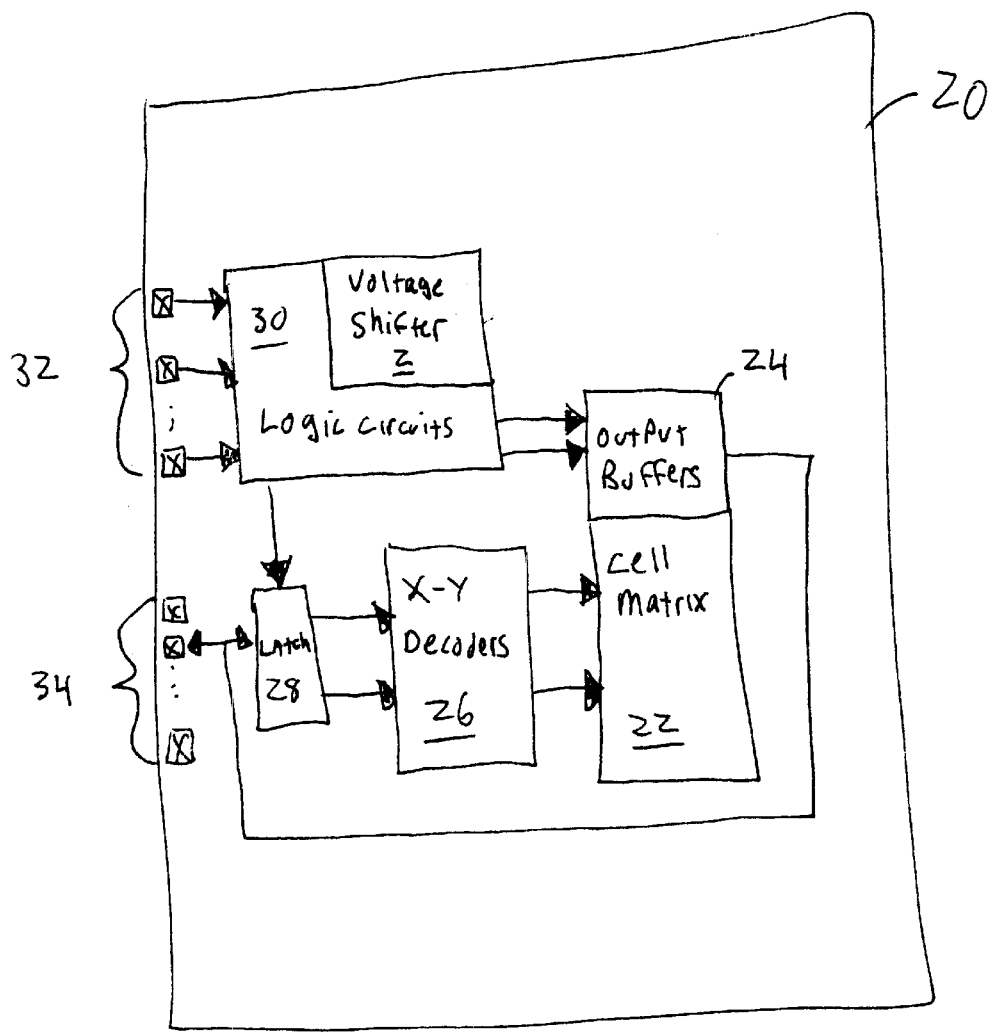
FIG. 5 is a block diagram of a One Time Programmable circuit including the voltage shifter shown in FIG. 2.

An example of an OTP 20 is shown in FIG. 5. Within the OTP memory 20 is contained a cell matrix 22, coupled to a set of output buffers 24. The output buffers are used to send data contained in the cell matrix 22 out to a set of input/output (address and data) pins 34, via a latch 28. A set of X–Y decoders accepts the input address from the set of input/output pins 34 and accesses the correct cells in the cell matrix 22. A set of logic circuits 30 also includes the voltage shifter 2 of FIG. 2. The set of logic circuits accepts signals of many types through a set of input pins 32, including enable signals, supply voltages, etc. The voltage shifter 2 produces correct desired voltages for use in the latch 28, decoders 26, matrix 22, and output buffers 24, in addition to the logic circuits 30 themselves.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A CMOS voltage shifter comprising:
   a differential cell circuit portion coupled between a first and a second supply voltage reference, and including a first pair of transistors coupled in a cascode configuration;
   a first divider of the first supply voltage reference for generating a reference voltage value on a first internal circuit node that is coupled to gate terminals of the first pair of transistors; and
   a second divider of the first supply voltage reference for controlling the reference voltage value by a control circuit portion acting on the first divider, wherein the control circuit portion comprises:
   a drive transistor coupled between the first internal circuit node of the first divider and the second supply voltage reference, the drive transistor having a gate terminal coupled to a second internal circuit node of the second divider through a series of an enable transistor and an inverter.

2. The voltage shifter according to claim 1 wherein the drive transistor is sized to draw more current than a transistor of the first divider connected between the first supply voltage reference and the first internal circuit node.

3. The voltage shifter according to claim 1 wherein the control circuit portion further comprises a bias transistor connected between a third supply voltage reference and an input of the inverter.

4. The voltage shifter according to claim 3 wherein the bias transistor is driven by an input signal to the voltage shifter, and wherein the enable transistor is driven by a negation of the input signal.

5. The voltage shifter according to claim 3, further comprising a second pair of transistors having source terminals coupled respectively to drain terminals of the first pair of transistors, drain terminals of the second pair of transistors coupled to the third voltage reference, and gate terminals of the second pair of transistors driven by the input signal presented on an input terminal of the voltage shifter and by the negation thereof provided by an inverter.

6. The voltage shifter according to claim 5 wherein the second pair of transistors are drift transistors.

7. The voltage shifter according to claim 1 wherein the second divider comprises:

first, second and third transistors connected in a diode configuration and in series with one another between the first supply voltage reference and the second voltage reference, a gate terminal of the second transistor being connected to a drain terminal of the second transistor and to a source terminal of the third transistor and defining a second internal circuit node whereon a predetermined voltage value is presented dependent on the value of the first supply voltage reference.

8. The voltage shifter according to claim 7 wherein the second divider is sized to set the predetermined voltage value at one third the value of the first supply voltage reference.

9. An OTP memory for high-voltage applications incorporating a voltage shifter as recited in claim 1.

10. A One-Time Programmable memory, comprising:

a differential cell circuit portion coupled between a first and a second supply voltage reference, and including a first pair of transistors coupled in a cascode configuration and an output terminal at which a voltage shifted value is produced;

a first divider of the first supply voltage reference for generating a reference voltage value on a first internal node that is coupled to gate terminals of the first pair of transistors;

a second divider of the first supply voltage reference, the second divider having a second internal node at which a divider voltage is produced; and a control circuit portion coupled between the first and second internal nodes, the control circuit portion being structured to control the reference voltage value by acting on the first divider based on the divider voltage produced by the second divider.

11. The memory of claim 10 wherein the control circuit portion comprises:

a drive transistor coupled between the first internal circuit node of the first divider and the second supply voltage reference, the drive transistor having a gate terminal; and an inverter coupled between the gate terminal of the drive transistor and the second internal circuit node.

12. The memory of claim 11 wherein the control circuit portion comprises a bias transistor connected between a third supply voltage reference and an input of the inverter.

13. The memory of claim 11, further comprising an enable transistor coupled between the second internal circuit node and an input of the inverter, wherein the bias transistor is driven by an input signal to the voltage shifter, and wherein the enable transistor is driven by a negation of the input signal.

14. The memory of claim 10 wherein the second divider comprises:

first, second and third transistors connected in a diode configuration and in series with one another between the first supply voltage reference and the second voltage reference, a gate terminal of the second transistor being connected to a drain terminal of the second transistor and to a source terminal of the third transistor and defining the second internal circuit node.

15. The memory of claim 14 wherein the second divider is sized to set the divider voltage at one third of the first supply voltage reference.

16. A CMOS voltage shifter comprising:

a differential cell circuit portion coupled between a first and a second supply voltage reference, and including a pair of transistors having gate terminals coupled to each other;

a first divider of the first supply voltage reference for generating a reference voltage value on a first internal circuit node that is coupled to the gate terminals of the pair of transistors;

a drive transistor coupled between the first internal circuit node of the first divider and the second supply voltage reference, the drive transistor having a gate terminal; and a control transistor coupled between a third supply voltage reference and the gate terminal of the drive transistor, the third supply voltage reference having a value between the first and second supply voltage references.

17. The voltage shifter of claim 16, further comprising an inverter coupled between the control transistor and the gate terminal of the drive transistor.

18. The voltage shifter of claim 16, further comprising:

a second divider of the first supply voltage reference, the second divider having a second internal node at which a divider voltage is produced; and an enable transistor coupled between the second internal node and the gate terminal of the drive transistor.

19. The voltage shifter of claim 18 wherein the control transistor includes a gate terminal driven by an input signal and the enable transistor includes a gate terminal driven by a negation of the input signal.

* * * * *